United States Patent
Park et al.

(10) Patent No.: US 7,436,265 B2
(45) Date of Patent: Oct. 14, 2008

(54) CLOCK GENERATOR AND CLOCK GENERATING METHOD USING DELAY LOCKED LOOP

(75) Inventors: Joonbae Park, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 12 days.

(21) Appl. No.: 11/724,319

(22) Filed: Mar. 15, 2007

(65) Prior Publication Data

US 2007/0226531 A1    Sep. 27, 2007

(30) Foreign Application Priority Data

Mar. 17, 2006    (KR) ............. 10-2006-0024677

(51) Int. Cl.
*H03L 7/06*    (2006.01)
*H03L 7/16*    (2006.01)
*H03L 7/18*    (2006.01)

(52) U.S. Cl. .................... 331/18; 331/1 A; 331/16; 331/25; 327/158

(58) Field of Classification Search ............. 331/1 A, 331/2, 16–18, 25; 327/156–159
See application file for complete search history.

(56) References Cited

U.S. PATENT DOCUMENTS

| 6,943,609 | B2 * | 9/2005 | Zampetti et al. ............ 327/292 |
| 7,102,403 | B2 * | 9/2006 | Wang ............................ 327/158 |
| 2004/0257124 | A1 * | 12/2004 | Araki et al. ................... 327/101 |

* cited by examiner

*Primary Examiner*—David Mis

(57) ABSTRACT

Embodiments of a clock generator and a clock generating method can use a delay locked loop (DLL). In one embodiment, a clock generator can include a first oscillator to generate a first clock signal having a frequency corresponding to a control signal, a delay locked loop to generate a second clock signal having a frequency higher than that of the first clock signal, a frequency divider to receive the second clock signal to generate a third clock signal having a frequency lower than that of the second clock signal, a second oscillator to generate a fourth clock signal and a phase frequency detector to generate the control signal corresponding to a phase difference and/or a frequency difference between the third clock signal and the fourth clock signal.

18 Claims, 5 Drawing Sheets

1

CLOCK GENERATOR AND CLOCK GENERATING METHOD USING DELAY LOCKED LOOP

BACKGROUND

1. Field

The present invention relates to a clock generator and a clock generating method.

2. Background

A clock generator has been widely used to provide a microprocessor, a digital signal processor, an integration circuit and the like with a system clock. A clock generator using a phase locked loop (PLL) has been often used as a related art clock generator. The PLL clock generator generally includes a phase detector for detecting a phase difference between a clock signal provided by a frequency generator and a clock signal outputted from a frequency divider, a loop filter, a voltage controlled oscillator and a frequency divider. The loop filter is for removing a high frequency component from the phase difference detected by the phase detector, and the voltage controlled oscillator is for changing a frequency of an output clock signal according to the phase difference outputted by the loop filter. The frequency divider is for dividing the frequency of the output clock signal by N (e.g., N is a natural number) to output the divided output clock signal. Such a PLL clock generator has advantages including the frequency of the output clock signal is N times that of the input clock signal by including the frequency divider. Further, the frequency divider can be implemented by using a counter so that the implementation of the frequency divider is simple and the N value may be easily changed. However, there are also disadvantages including at least that a restored clock signal has an increased phase noise because the voltage controlled oscillator of the PLL clock generator employs a positive feed back circuit. Further, the phase noise is seriously increased if a noise of a supply voltage increases.

A delay locked loop (DLL) clock generator can include a phase detector for detecting a phase difference between a clock signal provided by a frequency generator and a clock signal outputted from a voltage controlled delay line, a loop filter and a voltage controlled delay line. The loop filter is for removing a high frequency component from the phase difference detected by the phase detector, and the voltage controlled delay line is for changing a delay of an input clock signal according to the phase difference outputted by the loop filter to generate an output clock signal. Since such a DLL clock generator does not include a voltage controlled oscillator, the DLL clock generator includes advantages in that the above-described disadvantages occurring in the PLL clock generator can be reduced or prevented. However, disadvantages of the DLL clock generator include the DLL clock generator can generate only an output clock signal having the same frequency as that of the clock signal provided by the frequency generator. U.S. Pat. No. 6,784,707 discloses a conventional DLL clock generator that addressed the above-described disadvantages by including a frequency multiplier for outputting a clock signal having a frequency that is N/2 times that of a clock signal transmitted from a frequency divider by using a plurality of clock signals. The plurality of clock signals are outputted from a voltage controlled delay line and each clock signal has a different delay. Herein, N means the number of delay cells included in the voltage controlled delay line. However U.S. Pat. No. 6,784,707 has disadvantages because N delay cells are required to obtain a frequency of N/2-tuple and the number of transistors included in the frequency multiplier has to be increased in proportion to N. That is, the complexity of the frequency divider of the PLL clock generator increases approximately in proportion to $\log_2 N$ and the complexity of the frequency multiplier disclosed in U.S. Pat. No. 6,784,707 also increases in proportion to N. Therefore, one drawback in the frequency generator of U.S. Pat. No. 6,784,707 is a large number of transistors are required to make a variety of frequencies.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Embodiments according to the application can provide a clock generator or clock generating method.

Embodiments according to the application can provide a clock generator or clock generating method using a DLL delay lock loop (DLL).

Embodiments according to the application can provide a clock generator or clock generating method using a DLL delay lock loop (DLL) that can solve disadvantages of the related or conventional art.

Embodiments according to the application can provide a DLL clock generator and a DLL clock generating method that can be less affected by a phase noise of an input voltage without using a voltage controlled oscillator.

Embodiments according to the application can provide a DLL clock generator and a DLL clock generating method capable of generating clock signals having frequencies that are various and accurate without increasing the complexity of hardware.

To achieve at least the above objects or following embodiments in whole or in part, there is provided a clock generator including: a first crystal oscillator for generating a first clock signal having a frequency corresponding to a control signal; a delay locked loop having a frequency multiply function for generating a second clock signal having a frequency higher than that of the first clock signal by using the first clock signal; a frequency divider for generating a third clock signal having a frequency lower than that of the second clock signal by using the second clock signal; a second crystal oscillator for generating a fourth clock signal; and a phase frequency detector for generating the control signal corresponding to a phase difference and a frequency difference between the third clock signal and the fourth clock signal.

To achieve at least the above objects or following embodiments in whole or in part, there is provided clock generating method including the steps of: (a) generating a second clock signal having a frequency higher than that of a first clock signal based on the first clock signal by using a delay locked loop having a frequency multiply function; (b) generating a third clock signal having a frequency lower than that of the second clock signal by using the second clock signal; and (c) changing the frequency of the first clock signal in response to a phase difference and a frequency difference between the third clock signal and a fourth clock signal.

Embodiments according to the application will be described with reference to the accompanying drawings. Embodiments are exemplary and are not to be construed as limiting. Many alternatives, modifications, and variations will be apparent to those skilled in the art.

Figure 1:
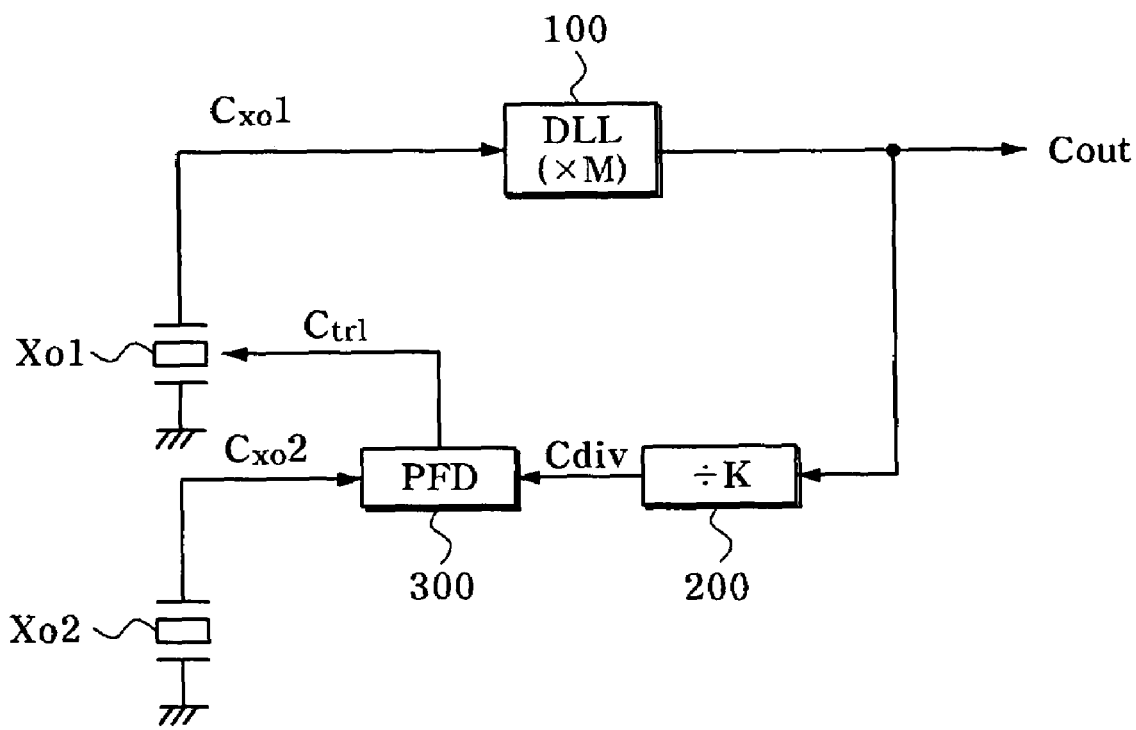
FIG. 1 is a diagram of a DLL clock generator in accordance with an embodiment of the application.

FIG. 1 is a diagram of a DLL clock generator in accordance with an embodiment of the application. As shown in FIG. 1, the clock generator can include a first oscillator Xo1 (e.g., a first crystal oscillator); a delay locked loop 100 having a frequency multiplier function; a frequency divider 200; a second oscillator Xo2 (e.g., a second crystal oscillator) and a phase frequency detector 300.

The first crystal oscillator Xo1 can generate a first clock signal Cxo1 having a frequency corresponding to a control signal Ctrl. A dynamic frequency range of the first crystal oscillator Xo1 can be wider than that of the second crystal oscillator Xo2. Preferably, the first crystal oscillator Xo1 may be a digitally controlled crystal oscillator for changing the frequency of the first clock signal Cxo1 according to a digital control signal Ctrl, or a voltage controlled crystal oscillator for changing the frequency of the first clock signal Cxo1 according to an analog control signal Ctrl. However, embodiments of the application are not intended to be so limited. Preferably, the frequency of the first clock signal Cxo1 is 10 times or more that of a fourth clock signal Cxo2.

The delay locked loop 100 having a frequency multiply function can generate a second clock signal Cout having a frequency higher than that of the first clock signal Cxo1 by using the first clock signal Cxo1. The second clock signal Cout can be an output clock signal that the DLL clock generator wants to obtain. Preferably, the frequency of the second clock signal Cout is M times that of the first clock signal. Preferably, M can be a programmable value. For example, if the delay locked loop 100 includes the frequency multiplier disclosed in U.S. Pat. No. 6,784,707, M may have a value corresponding to N/2, where N means the number of delay cells.

The frequency divider 200 can generate a third clock signal Cdiv having a frequency lower than that of the second clock signal Cout by using the second clock signal Cout. Preferably, the frequency of the third clock signal Cdiv can be equal to a value corresponding to the second clock signal frequency divided by K. Preferably, K can be a programmable value. The frequency divider 200 may be implemented by using, for example, a counter (not shown), and K preferably is a natural number.

The second crystal oscillator Xo2 can generate the fourth clock signal Cxo2. Preferably, the second crystal oscillator Xo2 may be a temperature compensated crystal oscillator for preventing (or reducing a possibility that) a frequency of the fourth clock signal Cxo2 from being changed according to temperature.

The phase frequency detector 300 can generate the control signal Ctrl corresponding to a phase difference and a frequency difference between the third clock signal Cdiv and the fourth clock signal Cxo2.

The DLL clock generator employing the above-described configuration in accordance with one embodiment of the application has advantages including the second clock signal Cout, e.g., output signal, having a variety of frequencies can be generated without increasing the hardware size (e.g., in comparison with a clock generator disclosed in U.S. Pat. No. 6,784,707).

For example, suppose that it is required to generate a 425 MHz clock signal and a 601 MHz clock signal. In case of the clock generator disclosed in U.S. Pat. No. 6,784,707, the 425 MHz clock signal and the 601 MHz clock signal may be generated by using a delay locked loop including 12 delay cells and a frequency oscillator of 1 MHz. However, a large number of delay cells have to be included in such a configuration, so that the complexity of hardware increases remarkably. Further, in case of the clock generator disclosed in U.S. Pat. No. 6,784,707, the 425 MHz clock signal and the 601 MHz clock signal can also be generated by using a delay locked loop including 12 delay cells and a frequency oscillator having a dynamic range from 100 MHz to 110 MHz. That is, the 425 MHz clock signal may be generated by setting an output frequency of the frequency oscillator to 425 MHz/4 and using 8 delay cells (corresponding to M=4) and the 601 MHz clock signal may also be generated by setting the output frequency of the frequency oscillator to 601 MHz/6 and using 12 delay cells (corresponding to M=6). According to this configuration, however, the frequency of the generated clock signal has an inaccurate value because it is difficult to set the output frequency of the frequency oscillator to 425 MHz/4 or 601 MHz/6 exactly.

In contrast, using the clock generator embodiment according to FIG. 1, it is possible to generate an output clock signal having an accurate frequency without increasing the complexity of hardware by using the first crystal oscillator Xo1 having the dynamic range from 100 MHz to 110 MHz and the second crystal oscillator Xo2 capable of outputting an exact clock signal of 1 MHz. For example, by setting M to 4 and K to 425, the frequency of the first clock signal Cxo1 can automatically become 425 MHz/4 according to the control signal Ctrl, so that the output clock signal, e.g., the second clock signal Cout, can have the frequency of 425 MHz. Further, by setting M to 6 and K to 601, the frequency of the first clock signal Cxo1 can automatically become 601 MHz/6 according to the control signal Ctrl, so that the output clock signal, e.g., the second clock signal Cout, can have the frequency of 601 MHz. Since M has an upper value or the maximum value 6, the complexity of the delay locked loop scarcely increases. Moreover, the accuracy of the frequency of the second clock signal Cout can be maintained by using the second crystal oscillator that is capable of providing an accurate frequency. For example, since the clock generator according to one embodiment employs the first crystal oscillator Xo1 having a wide dynamic range and the second crystal oscillator having an accurate frequency, it is possible to obtain an output signal capable of meeting a wide dynamic range and an accurate frequency at the same time.

Further, embodiments of a clock generator according to the application have advantages including that the accuracy of the frequency of the output clock signal, e.g., the second clock signal Cout, can be maintained by the second crystal oscillator Xo2 capable of providing an accurate frequency. For example, the frequency of the second clock signal Cout can have a value that is K times the frequency of the fourth clock signal Cxo2 outputted from the second crystal oscillator Xo2 by using a closed loop control. Since the second crystal oscillator Xo2 can provide the fourth clock signal Cxo2 having an accurate frequency, the second clock signal Cout can also have an accurate frequency that is K times that of the fourth clock signal.

Further, the clock generator of the embodiment of FIG. 1 is advantageous in that the output clock signal, e.g., the second clock signal, has a wide dynamic range. For example, in case of obtaining the output signal, e.g., the second clock signal Cout, having a wide dynamic range from 1 to 5 GHz, the first crystal oscillator Xo1 having a dynamic range from 100 to 110 MHz and the delay locked loop 100 capable of multiplying a frequency by 10 to 50 times may be used. For example, since the first clock signal Cxo1 has the dynamic range from 100 to 110 MHz, the second clock signal Cout having a frequency from 1.0 to 1.1 GHz can be obtained by setting M to 10. If the frequency of the fourth clock signal Cxo2 generated by the second crystal oscillator X02 is 1 MHz, the frequency of the second clock signal Cout becomes 1.000 GHz in case of setting K of the frequency divider 200 to 1000. The frequency of the second clock signal Cout can become 1.001 GHz in case of setting K to 1001, and the frequency of the second clock signal Cout can become 1.100 GHz in case of setting K to 1100. Accordingly, the second clock signal Cout having the dynamic range from 1.0 to 1.1 GHZ can be obtained, for example, while changing the second clock signal frequency according to K. Further, if M is set to 11, the second clock signal Cout having the dynamic range from 1.1 to 1.2 GHZ may be obtained, for example, while changing the second clock signal frequency according to K. When M is set to 49, the second clock signal Cout having the dynamic range from 4.9 to 5.0 GHZ may be obtained, for example, changing the second clock signal frequency according to K. As described above, it is possible to obtain the second clock signal Cout having the dynamic range from 1.0 to 5.0 GHZ by changing M in such a manner.

In addition, embodiments of a clock generator according to the application have advantages including that it is possible to increase the resolution of the output clock signal, e.g., the second clock signal. Referring to the example of the dynamic range from 1 to 5 GHZ, if the frequency of the fourth clock signal Cxo2 generated by the second crystal oscillator Xo2 is 1 MHz, signals can be generated in frequency units of 1 GHZ. That is, signals of 1.000 GHZ, 1.001 GHz, 1.002 GHz, . . . , 5.000 GHz frequency may be generated. In this case, K can be variable within a range from 1000 to 5000. If it is required to increase the resolution by 10 times, the second crystal oscillator Xo2 for generating a signal of 0.1 MHz frequency and the frequency divider 200 for changing K within a range from 10,000 to 50,000 may simply be used. Since the hardware complexity of the frequency divider 200 scarcely increases although K increases, it is possible to improve the resolution without increasing the hardware complexity by using such a configuration.

Figure 2:
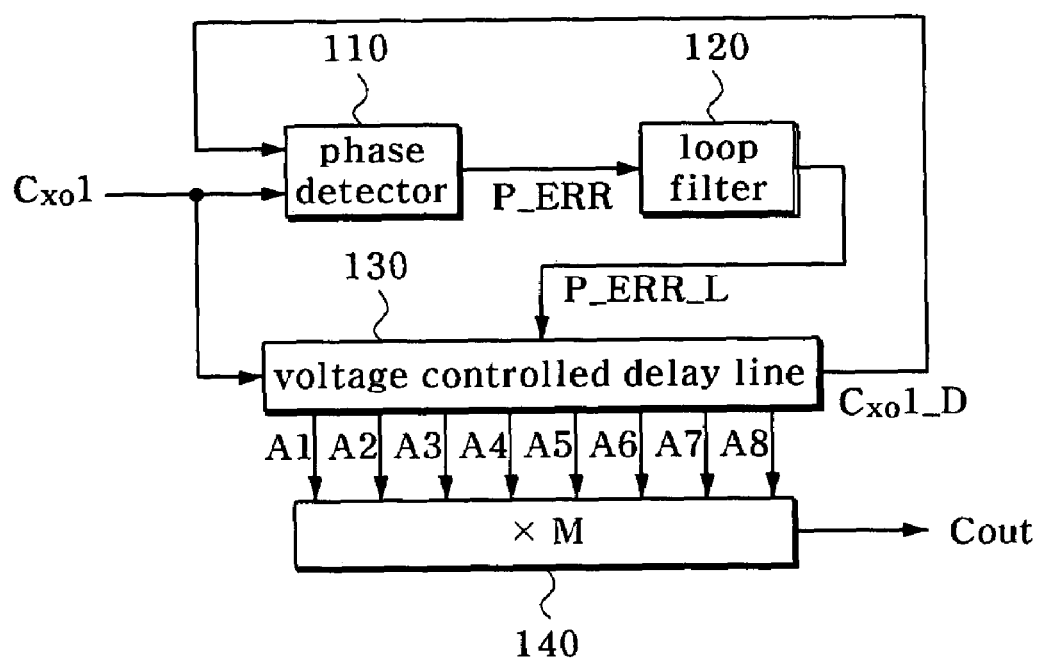
FIG. 2 shows a diagram of an embodiment of a delay locked loop having a frequency multiply function employed in a clock generator shown in FIG. 1.

FIG. 2 shows a diagram of an embodiment of a delay locked loop having a frequency multiply function. The delay lock loop shown in FIG. 2 can be used in the clock generator shown in FIG. 1. However, embodiments of the application are not intended to be so limited.

As shown in FIG. 2, the delay locked loop includes a phase detector 110; a loop filter 120; a voltage controlled delay line 130; and a frequency multiplier 140. The phase detector 110 can obtain a phase difference P_ERR between the first clock signal Cxo1 and a fifth clock signal Cxo1_D.

The loop filter 120 can receive the phase difference P_ERR and remove a high frequency component from the phase difference P_ERR to output a removed phase difference.

The voltage controlled delay line 130 can output at least a portion of a plurality of sixth clock signals (e.g., A1, A2, . . . , A8) generated by delaying the first clock signal Cxo1. Although an example where all the sixth clock signals (e.g., A1, A2, . . . , A8) are outputted to the frequency multiplier 140 is illustrated in FIG. 2. However, embodiments of the application are not intended to be so limited. For example, a portion of the plurality of sixth clock signals (e.g., A1, A2, . . . , A8), e.g., only A1 to A4 signals, can be provided to the frequency multiplier 140. Delays of the plurality of sixth clock signals (e.g., A1, A2, . . . , A8) are changed in response to the phase difference P_ERR_L where a high frequency component is removed, and the fifth clock signal Cxo1_D can be one of the plurality of sixth clock signals (e.g., A1, A2, . . . , A8).

The frequency multiplier 140 can generate the second clock signal Cout having a frequency higher than that of the first clock signal Cxo1 by using the outputted sixth clock signals (e.g., A1, A2, . . . , A8).

Figure 3:
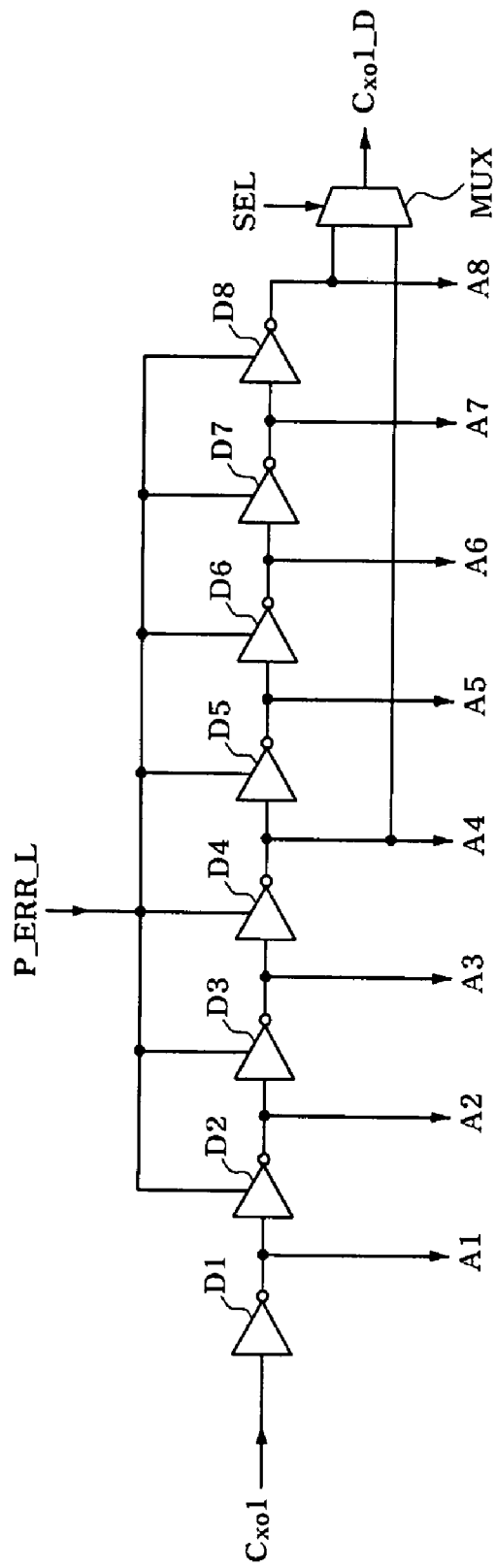
FIG. 3 illustrates an embodiment of a voltage controlled delay line employed in the delay locked loop shown in FIG. 2.

FIG. 3 illustrates an embodiment of the voltage controlled delay line that can be used in the delay locked loop shown in FIG. 2. However, embodiments of the application are not intended to be so limited. As shown in FIG. 3, the voltage controlled delay line can include a plurality of delay cells (e.g., D1, D2, . . . , D8) connected in series that output the plurality of sixth clock signals (e.g., A1, A2, . . . , A8), and a multiplexer MUX can receive at least two signals (e.g., A4, A8) of the sixth clock signals (e.g., A1, A2, . . . , A8) and output a signal selected from the inputted signals (e.g., A4, A8) according to a selection signal SEL as the fifth clock signal Cxo1_D.

Each delay of the plurality of delay cells (e.g., D1, D2, . . . , D8) can be changed in response to the phase difference P_ERR_L where a high frequency component is removed. The first clock signal Cxo1 is inputted to a first delay cell D1 of the plurality of delay cells (e.g., D1, D2, . . . , D8). Each of the plurality of delay cells (e.g., D1, D2, . . . , D8) may be an inverter.

By using such a configuration, the voltage controlled delay line shown in FIG. 3 can vary a delay of each delay cell according to the selection signal SEL, so that the output clock signal, e.g., the second clock signal Cout, can be varied by changing M. For example, in comparison with a case where A8 is outputted from the multiplexer MUX by the selection signal SEL, a delay occurring in each delay cell increases if A4 is outputted from the multiplexer MUX by the selection signal SEL. Therefore, M and the frequency of the second clock signal Cout may decrease.

Figure 4:
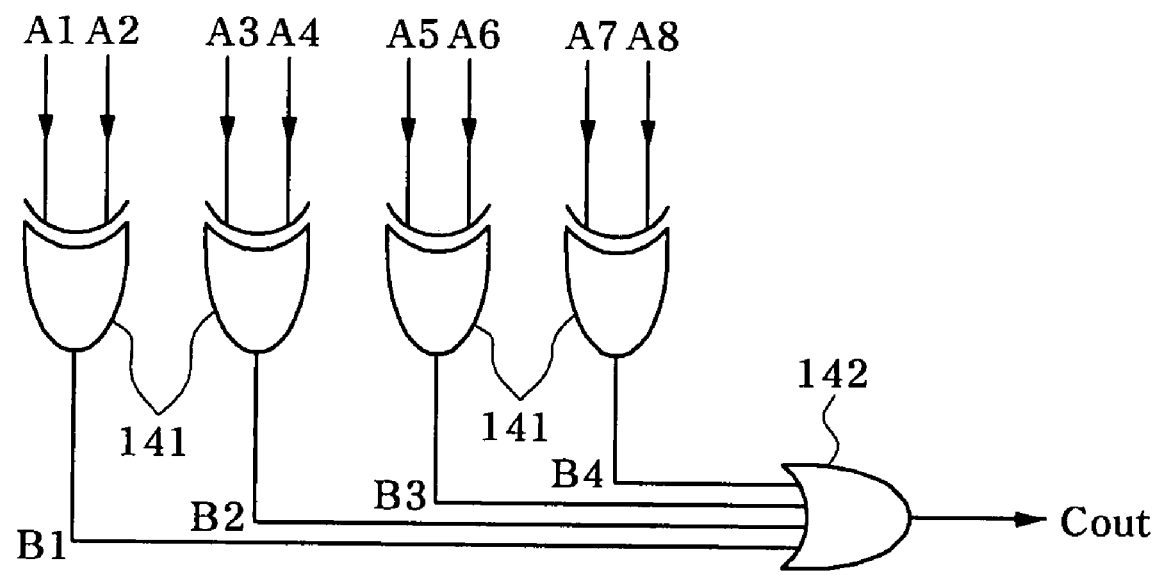
FIG. 4 shows an embodiment of a frequency multiplier employed in the delay locked loop shown in FIG. 2.

FIG. 4 shows an embodiment of the frequency multiplier that can be used in the delay locked loop shown in FIG. 2. However, embodiments of the application are not intended to be so limited. As shown in FIG. 4, the frequency multiplier includes a plurality of XOR operators 141 and an OR operator 142.

The plurality of XOR operators 141 can receive the plurality of sixth clock signals (e.g., A1, A2, . . . , A8) and perform XOR operations between adjacent two clock signals to output the XOR result (e.g., B1, B2, B3, B4). The OR operator 142 can perform an OR operation on the signals (e.g., B1, B2, B3, B4) outputted from the plurality of XOR operators 141 and output the OR result as the second clock signal Cout.

Therefore, the second clock signal Cout outputted from the frequency divider shown in FIG. 4 can have a value calculated by formula 1.

$$Cout=(A1\,XOR\,A2)OR(A3\,XOR\,A4)OR\ldots OR(A(2m-1)XOR\,A(2m))\quad\text{[formula 1]}$$

In formula 1, A1 to A(2m) mean the plurality of sixth clock signals (e.g., A1, A2, . . . , A8) and XOR and OR indicate an exclusive logical sum and a logical sum, respectively.

Figure 5:
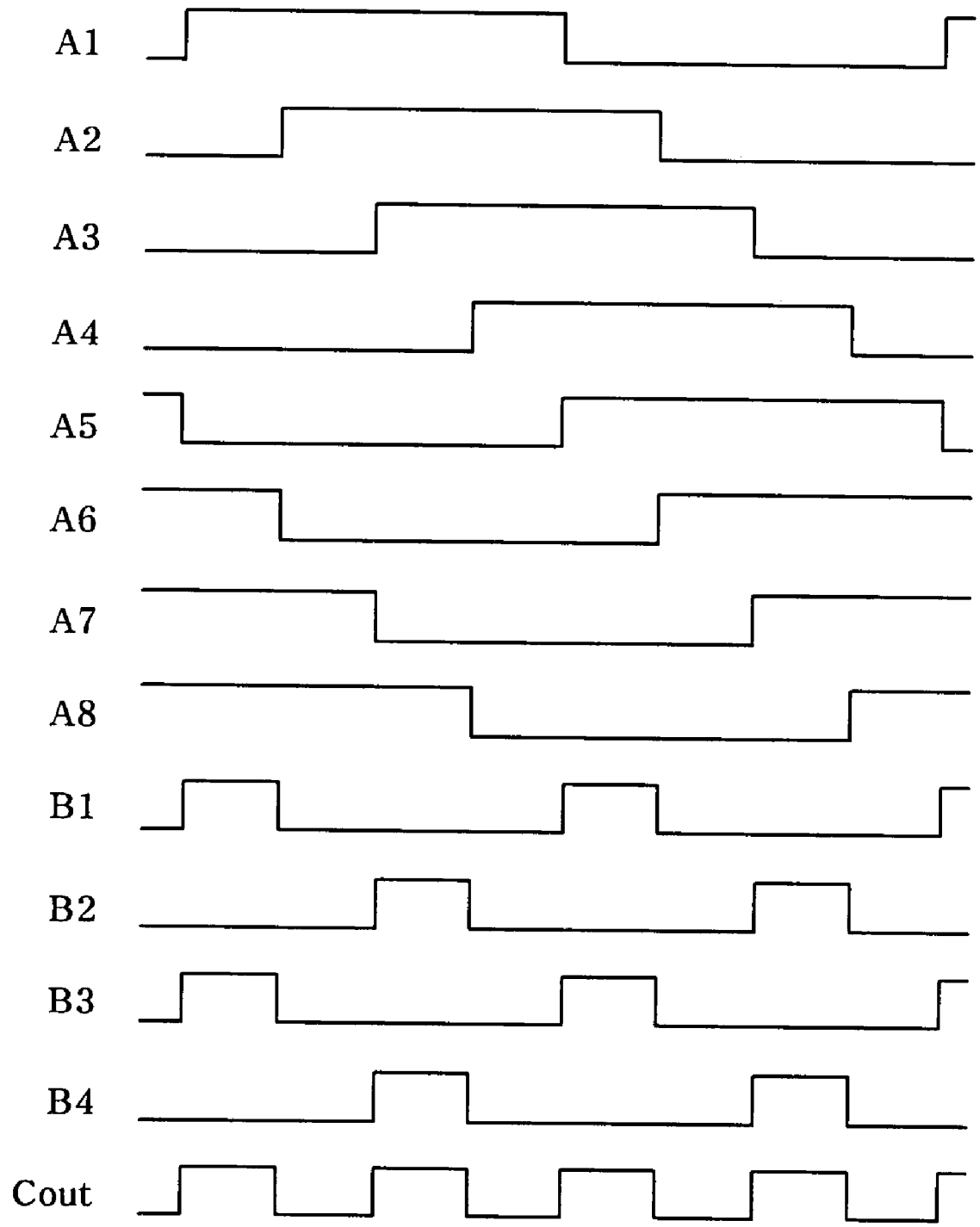
FIG. 5 provides a diagram displaying each signal shown in FIG. 4.

As shown in FIG. 5, described in greater detail below, the pre-signals (B1, B2) among the signals (B1, B2, B3, B4)

outputted from the XOR operators 141 are the same as the post-signals (B3, B4). Accordingly, it is possible to omit the XOR operators 141 outputting the post-signals (B3, B4) among the XOR operators 141 of the frequency multiplier.

FIG. 5 is a diagram displaying each signal shown in FIG. 4. The plurality of sixth clock signals (e.g., A1, A2, . . . , A8), the signals (B1, B2, B3, B4) outputted from the XOR operators 141 and the second clock signal Cout are shown in FIG. 5.

As shown in FIG. 5, a period of the generated second clock signal Cout can be two times a delay occurring in each delay cell. Accordingly, if the delay of each delay cell is varied, for example, using the method shown in FIG. 3, the period of the second clock signal Cout may be varied.

Figure 6:
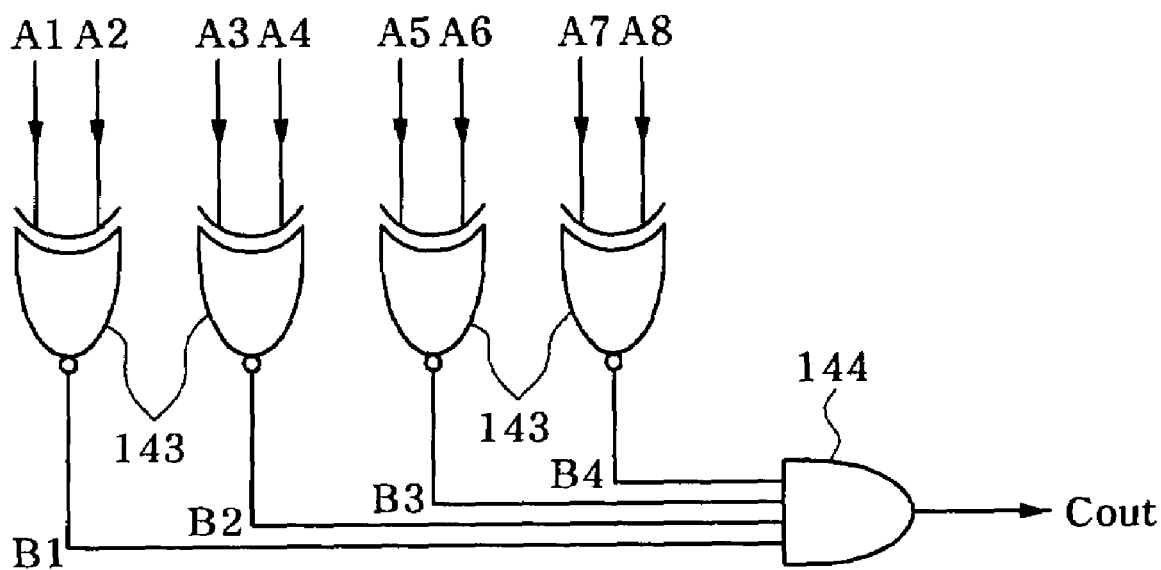
FIG. 6 is a diagram showing another embodiment of a frequency multiplier employed in the delay locked loop shown in FIG. 2.

FIG. 6 is a diagram showing another embodiment of a frequency multiplier that can be used in the delay locked loop shown in FIG. 2. However, embodiments of the application are not intended to be so limited. As shown in FIG. 6, the frequency multiplier can include a plurality of XNOR operators 143 and an AND operator 144.

The plurality of XNOR operators 143 can receive the plurality of sixth clock signals (e.g., A1, A2, . . . , A8) and perform XNOR operations between adjacent two clock signals to output the XNOR result (B1, B2, B3, B4) shown in FIG. 6.

The AND operator 144 can perform an AND operation on the signals (B1, B2, B3, B4) outputted from the plurality of XNOR operators 143 and output the AND result as the second clock signal Cout.

Therefore, the second clock signal Cout outputted from the frequency divider shown in FIG. 6 can have a value calculated by formula 2.

$$Cout = (A1 \text{ XNOR } A2) \text{ AND } (A3 \text{ XNOR } A4) \text{ AND } \ldots \text{ AND } (A(2m-1) \text{ XNOR } A(2m)) \quad \text{[formula 2]}$$

In formula 2, A1 to A(2m) mean the plurality of sixth clock signals (e.g., A1, A2, . . . , A8) and XNOR and AND indicate an exclusive negative logical sum and a logical product, respectively.

The pre-signals (B1, B2) among the signals (B1, B2, B3, B4) outputted from the XNOR operators 143 can be the same as the post-signals (B3, B4). Accordingly, it is possible to omit the XNOR operators 143 outputting the post-signals (B3, B4) among the XNOR operators 143 of the frequency multiplier.

Each signal of the frequency multiplier shown in FIG. 6 can be easily understood with reference to FIGS. 4 and 5, and thus an additional detailed description is omitted.

Embodiments of a DLL clock generator and DLL clock generating method in accordance with the application have various advantages. For example, embodiments of DLL clock generators and methods can be less affected by a phase noise of an input voltage because a voltage controlled oscillator is not employed. Further, embodiments of a DLL clock generator and a DLL clock generating method can generate clock signals having frequencies which are various and accurate without increasing the complexity of hardware.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A clock generator, comprising:
a first oscillator configured to generate a first clock signal having a frequency corresponding to a control signal;
a delay locked loop configured to receive the first clock signal and generate a second clock signal having a frequency higher than that of the first clock signal;
a frequency divider configured to receive the second clock signal and generate a third clock signal having a frequency lower than that of the second clock signal;
a second oscillator configured to generate a fourth clock signal; and
a phase frequency detector configured to generate the control signal corresponding to a phase difference and a frequency difference between the third clock signal and the fourth clock signal.

2. The clock generator of claim 1, wherein the second clock signal is an output clock signal of the clock generator.

3. The clock generator of claim 1, wherein a frequency dynamic range of the first oscillator is wider than that of the second oscillator.

4. The clock generator of claim 1, wherein the first oscillator is a digitally controlled crystal oscillator and the second oscillator is a temperature compensated crystal oscillator.

5. The clock generator of claim 1, wherein the frequency of the second clock signal is equal to the frequency of the first clock signal multiplied by M, and the frequency of the third clock signal is equal to the frequency of the second clock signal divided by K, wherein M and K are variable integers.

6. The clock generator of claim 1, wherein the frequency of the first clock signal is 10 times or more than that of the fourth clock signal.

7. The clock generator of claim 1, wherein the delay locked loop comprises:
a phase detector configured to determine a phase difference between the first clock signal and a fifth clock signal;
a loop filter configured to reduce a high frequency component from the phase difference;
a voltage controlled delay line configured to output at least a portion of a plurality of sixth clock signals generated by delaying the first clock signal; and
a frequency multiplier configured to receive the plurality of sixth clock signals and generate the second clock signal having the frequency higher than that of the first clock signal,
wherein delays of the plurality of sixth clock signals are configured to change in response to the phase difference where the high frequency component is reduced, and wherein the fifth clock signal is one of the plurality of sixth clock signals.

8. The clock generator of claim 7, wherein the voltage controlled delay line comprises:
a plurality of delay cells coupled in series each to output one of the plurality of sixth clock signals; and a multiplexer configured to receive at least two signals of the sixth clock signals and output a signal selected from the received signals according to a selection signal as the fifth clock signal, wherein each delay of the plurality of delay cells is changed in response to the phase difference where the high frequency component is reduced, and wherein a first delay cell of the plurality of delay cells is configured to receive the first clock signal.

9. The clock generator of claim 7, wherein the frequency multiplier is configured to generate the second clock signal by performing a logical operation corresponding to a formula of the second clock signal=(A1 XOR A2) OR (A3 XOR A4) OR . . . OR (A(2m−1) XOR A(2m)), wherein A1 to A(2m) are the plurality of sixth clock signals, respectively, and wherein XOR and OR indicate an exclusive logical sum and a logical sum, respectively.

10. The clock generator of claim 7, wherein the frequency multiplier is configured to generate the second clock signal by performing a logical operation corresponding to a formula of the second clock signal=(A1 XNOR A2) AND (A3 XNOR A4) AND . . . AND (A(2m−1) XNOR A(2m)), wherein A1 to A(2m) are the plurality of sixth clock signals, and wherein XNOR and AND indicate an exclusive negative logical sum and a logical product, respectively.

11. A clock generating method, comprising:
 (a) generating a second clock signal having a frequency higher than that of a first clock signal using a delay locked loop having a frequency multiply function;
 (b) generating a third clock signal having a frequency lower than that of the second clock signal by using the second clock signal; and
 (c) changing the frequency of the first clock signal in response to a phase difference and a frequency difference between the third clock signal and a fourth clock signal.

12. The method of claim 11, wherein the second clock signal is an output clock signal.

13. The method of claim 11, wherein the first clock signal is generated by a first oscillator and the fourth clock signal is generated by a second oscillator.

14. The method of claim 13, wherein a frequency dynamic range of the first oscillator is greater than that of the second oscillator.

15. The method of claim 13, wherein the first oscillator is a digitally controlled crystal oscillator and the second oscillator is a temperature compensated crystal oscillator.

16. The method of claim 11, wherein the frequency of the first clock signal is 10 times or more than that of the fourth clock signal.

17. The method of claim 11, wherein the frequency of the second clock signal is equal to the frequency of the first clock signal multiplied by M, and the frequency of the third clock signal is equal to the frequency of the second clock signal divided by K, wherein M and K are variable integers.

18. The method of claim 11, wherein the generating a second clock signal includes:
 obtaining a phase difference between the first clock signal and a fifth clock signal;
 filtering a high frequency component from the phase difference;
 generating a plurality of sixth clock signals by delaying the first clock signal; and
 generating the second clock signal having the frequency higher than that of the first clock signal by using at least a portion of the plurality of sixth clock signals,
 wherein delays of the plurality of sixth clock signals are changed in response to the filtered phase difference, and wherein the fifth clock signal is one of the plurality of sixth clock signals.

* * * * *